United States Patent [19]

Grimes et al.

[11] Patent Number: 5,571,320

[45] Date of Patent: Nov. 5, 1996

[54] SPIRAL HEATER FOR USE IN CZOCHRALSKI CRYSTAL PULLERS

[75] Inventors: H. Michael Grimes, Plano; Farouk A. Hariri, Sherman, both of Tex.

[73] Assignee: Texas Instruments Incorporated, Dallas, Tex.

[21] Appl. No.: 474,280

[22] Filed: Jun. 7, 1995

Related U.S. Application Data

[62] Division of Ser. No. 371,664, Jan. 11, 1995, which is a continuation of Ser. No. 70,628, Jun. 1, 1993, abandoned.

[51] Int. Cl.⁶ .................................................. C30B 15/20
[52] U.S. Cl. .............................. 117/32; 117/34; 117/217; 117/222; 219/424; 373/163
[58] Field of Search .................................. 117/13, 20, 32, 117/217, 222, 917, 931; 219/420, 424; 373/139, 160, 163

[56] References Cited

U.S. PATENT DOCUMENTS

| | | | |
|---|---|---|---|
| 4,830,703 | 5/1989 | Matsutani | 117/208 |
| 4,849,188 | 7/1989 | Takasu et al. | 117/217 |
| 4,956,339 | 9/1990 | Yamazaju | 117/32 |
| 5,009,865 | 4/1991 | Boden et al. | 117/32 |
| 5,178,720 | 1/1993 | Frederick | 117/32 |
| 5,196,085 | 3/1993 | Szekely | 117/208 |
| 5,268,063 | 12/1993 | Kaneko et al. | 117/32 |

FOREIGN PATENT DOCUMENTS

| | | |
|---|---|---|
| 2107646 | 2/1971 | Germany . |
| 59-121183 | 12/1982 | Japan . |
| 59-137394 | 8/1984 | Japan . |
| 60-210592 | 10/1985 | Japan . |
| 1347108 | 2/1974 | United Kingdom . |

OTHER PUBLICATIONS

Combination Heater–Magnetic Solenoid Coil(s) for Suppressing Melt Convection in Crystal Growth, IBM Technical Bulletin, vol. 26, No. 9, Feb. 1984.

Combination Heater Magnetic Solenoid Coil for Suppressing Melt Convection in Crystal Growth; Giess et al, IBM Technical Disclosures Bulletin (Feb. 1984); Bol. 26, No. 9, p. 4716, 2 refs.

Primary Examiner—Felisa C. Garrett
Attorney, Agent, or Firm—Warren L. Franz; W. James Brady, III; Richard L. Donaldson

[57] ABSTRACT

The invention defines an apparatus for controlling oxygen content in Czochralski silicon crystal pullers in which silicon is melted in a quartz crucible. The apparatus includes a susceptor 10, a quartz crucible 12 in said susceptor, a cable 16 for lowering a seed crystal 14 into silicon melted in said crucible, and a combination spiral heater/magnetic coil 25 for heating and melting silicon in said crucible, and for producing a magnetic field around the crucible.

1 Claim, 4 Drawing Sheets

5,571,320

SPIRAL HEATER FOR USE IN CZOCHRALSKI CRYSTAL PULLERS

This is a divisional of application Ser. No. 08/371,664 filed Jan. 11, 1995; which is a continuation of application Ser. No. 08/070,628 filed Jun. 1, 1993 now abandoned.

FIELD OF THE INVENTION

This invention relates to semiconductor materials, and more particularly to a spiral magnetic coil and heater for suppression of SiO generation and control of oxygen and impurity profile in Czochralski silicon crystal growing apparatus.

BACKGROUND OF THE INVENTION

In Czochralski silicon crystal pullers, the silicon monoxide (SiO) generation from the reaction between molten silicon (Si) and the quartz crucible ($SiO_2$) starts at about 1150° C. At this temperature SiO constitutes the major volatile component, besides inert gas.

The vapor pressure of SiO at 1150° C. is 0.05 millimeters of mercury. The SiO vapors condense on the cooler parts of the crystal puller and they also react with hot graphite (the heater), leading to carbon monoxide (CO) generation. Carbon monoxide is the major precursor for carbon contribution in the finished silicon crystal.

The suppression of SiO generation is important for reduction of both oxygen and carbon in silicon crystals.

Conventional Czochralski crystal furnaces have been equipped with an external magnetic field. This magnetic field imparts unique properties to semiconductor materials, one of which is to reduce the oxygen content of the crystal.

Conventional magnetic Czochralski crystal furnaces require an expensive external power supply and magnet to provide the magnetic field. Operation and maintenance of this equipment is expensive and cost prohibitive for most applications.

BRIEF SUMMARY OF THE INVENTION

The invention provides a method and apparatus for the suppression of silicon monoxide generation and control of the oxygen content of crystal growth in a Czochralski crystal puller. A spiral heater/magnetic coil combination is placed around the crucible in the furnace to provide both the heat required in crystal pulling and the magnetic field used to reduce oxygen content of the molten silicon. The current used to heat the furnace is also used to provide the magnetic field in the crystal puller. This feature reduces the cost of operation and maintenance of the magnetic Czochralski crystal furnace. The material grown from such a furnace provides a cost competitive material, while providing desirable characteristics in the pulled crystal.

The method for control of oxygen content in silicon crystals formed in a Czochralski crystal puller includes the application of the current through the spiral coil heater, and maintaining the current at a value to properly heat and melt the silicon, and to provide the desired magnetic field around the molten silicon during the crystal pulling procedure.

An apparatus for controlling oxygen content in Czochralski silicon crystal pullers in which silicon is melted in a quartz crucible, includes a susceptor, a quartz crucible in the susceptor, a cable for lowering a seed crystal into silicon melted in the quartz crucible, and a combination spiral heater/magnetic coil, having a circular cross-section, for heating and melting silicon in the quartz crucible and for producing a magnetic field around the quartz crucible.

The technical advance represented by the invention, as well as the objects thereof, will become apparent from the following description of a preferred embodiment of the invention, when considered in conjunction with the accompanying drawings and the novel features set forth in the appended claims.

DESCRIPTION OF A PREFERRED EMBODIMENT

Figure 1:
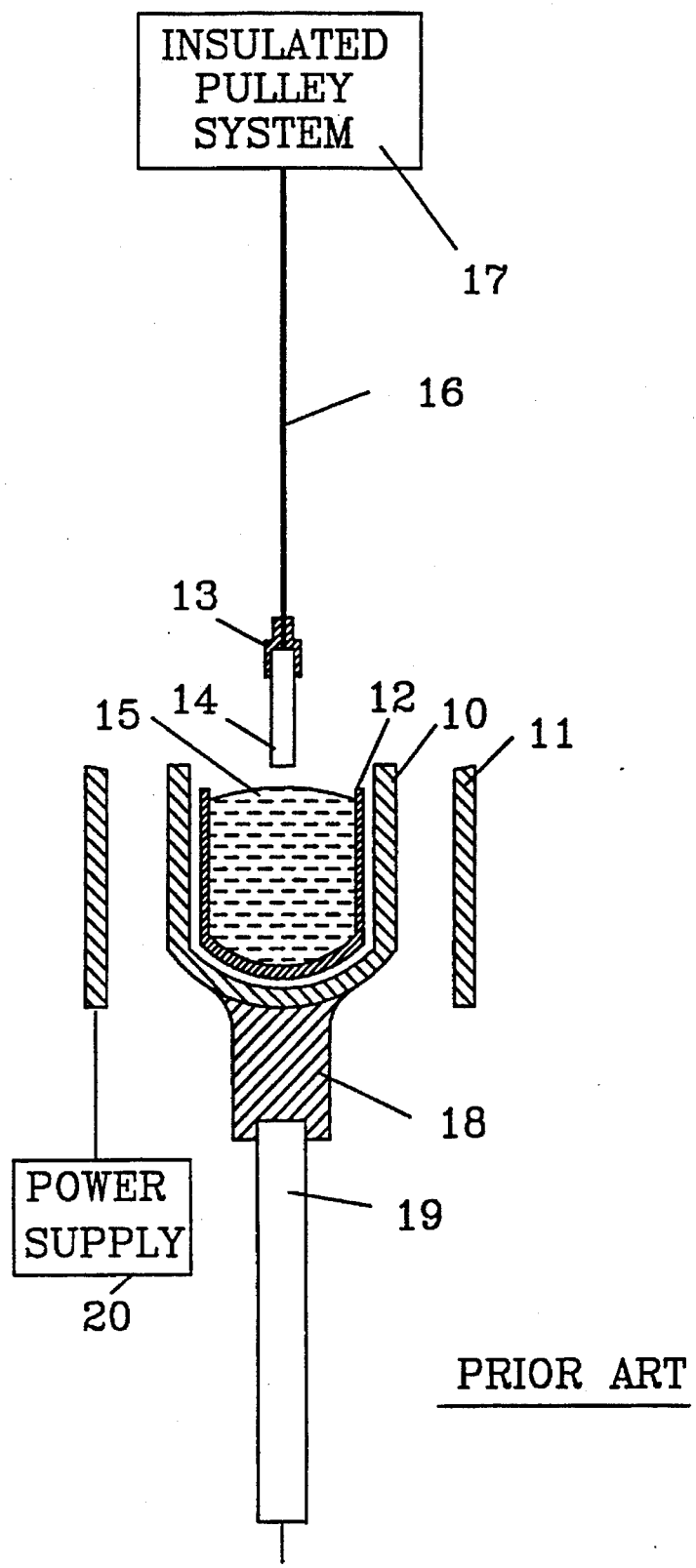
FIG. 1 (Prior Art) illustrates the basic components of a Czochralski crystal puller.

FIG. 1 illustrates the basic components of a Czochralski crystal puller apparatus of the prior art. A susceptor 10 is mounted on a graphite pedestal 18 and a crucible rotation shaft 19. Inside susceptor 10 is a quartz crucible 12. Quartz crucible 12 is filled with polysilicon 15. Susceptor 10 is heated by graphite heater 11 to melt silicon 15.

A seed crystal 14 is attached to a seed holder 13. Seed crystal 14 is raised and lowered by a stainless steel cable 16 which is mounted on an insulated pulley system 17. A power supply 20 is attached to heater 11 to provide power to melt silicon 15. The applied voltage 20 may be varied during the crystal growth to change the stirring effects of the melt.

Figure 2:
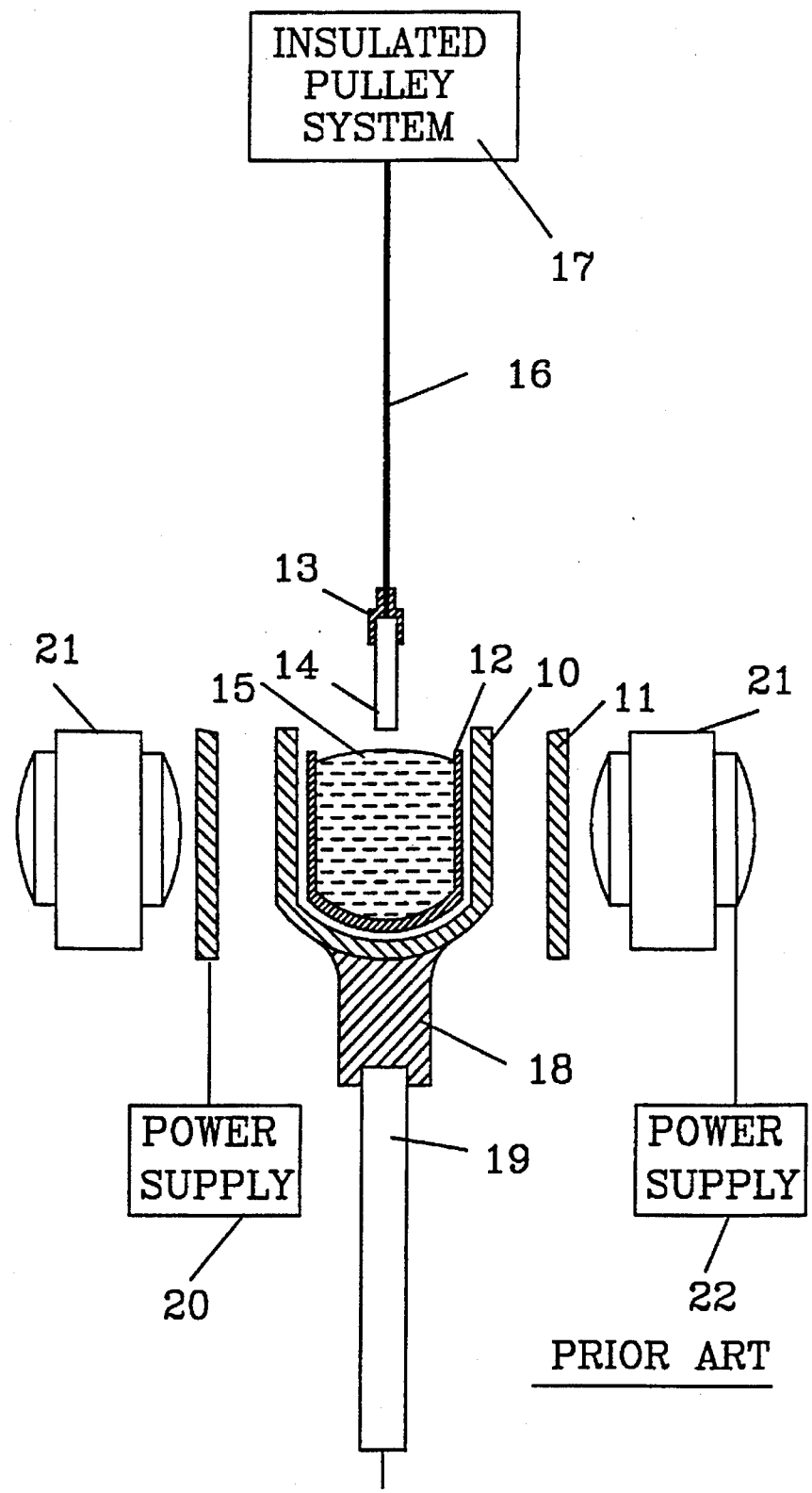
FIG. 2 (Prior Art) illustrates the basic components of a magnetic Czochralski crystal puller.

FIG. 2 illustrates a prior art Czochralski magnetic crystal puller. The puller of FIG. 2 includes the basic components of FIG. 1, and, in addition, has magnetic coil 21 enclosing the graphite susceptor 10 and heater 11. A second power supply 22 is required to power magnetic coil 21.

Figure 3:
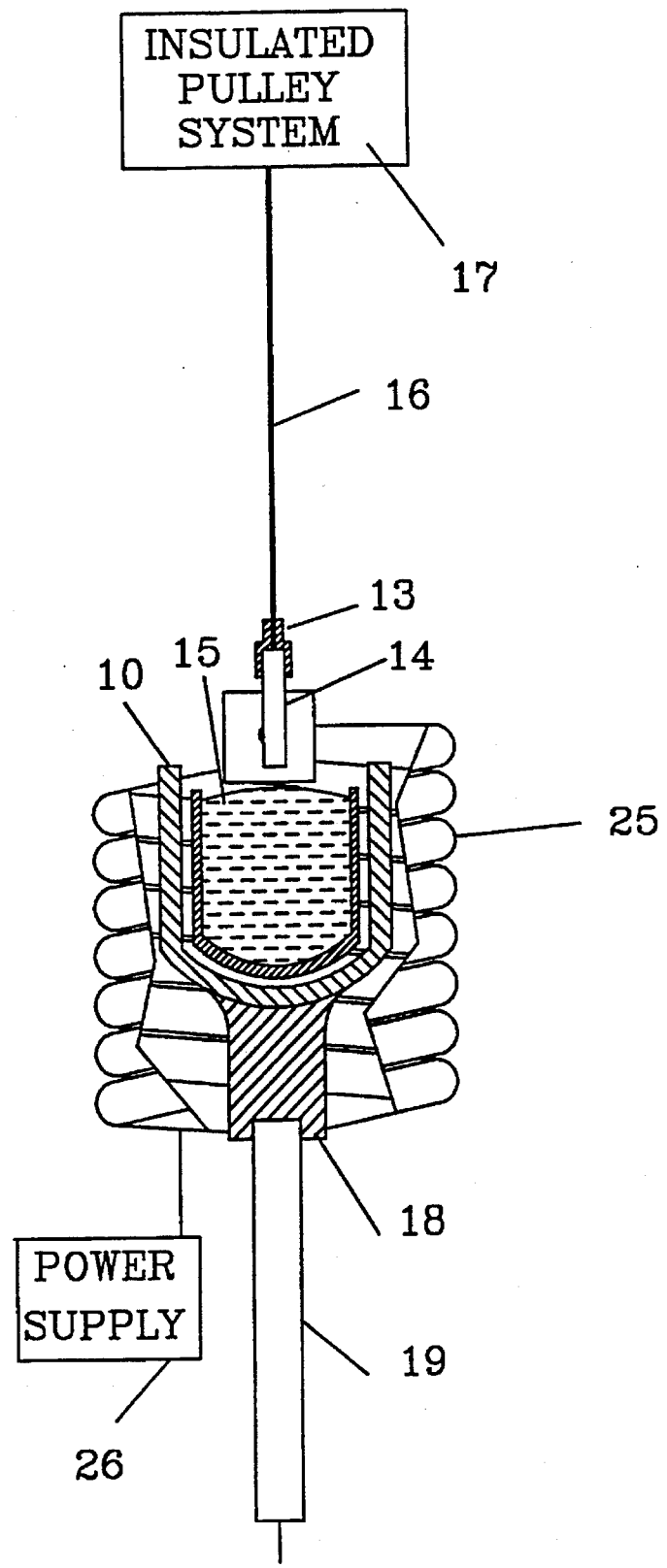
FIG. 3 illustrates the Czochralski crystal puller using a spiral heater coil that also provides a magnetic field.
Figure 4:
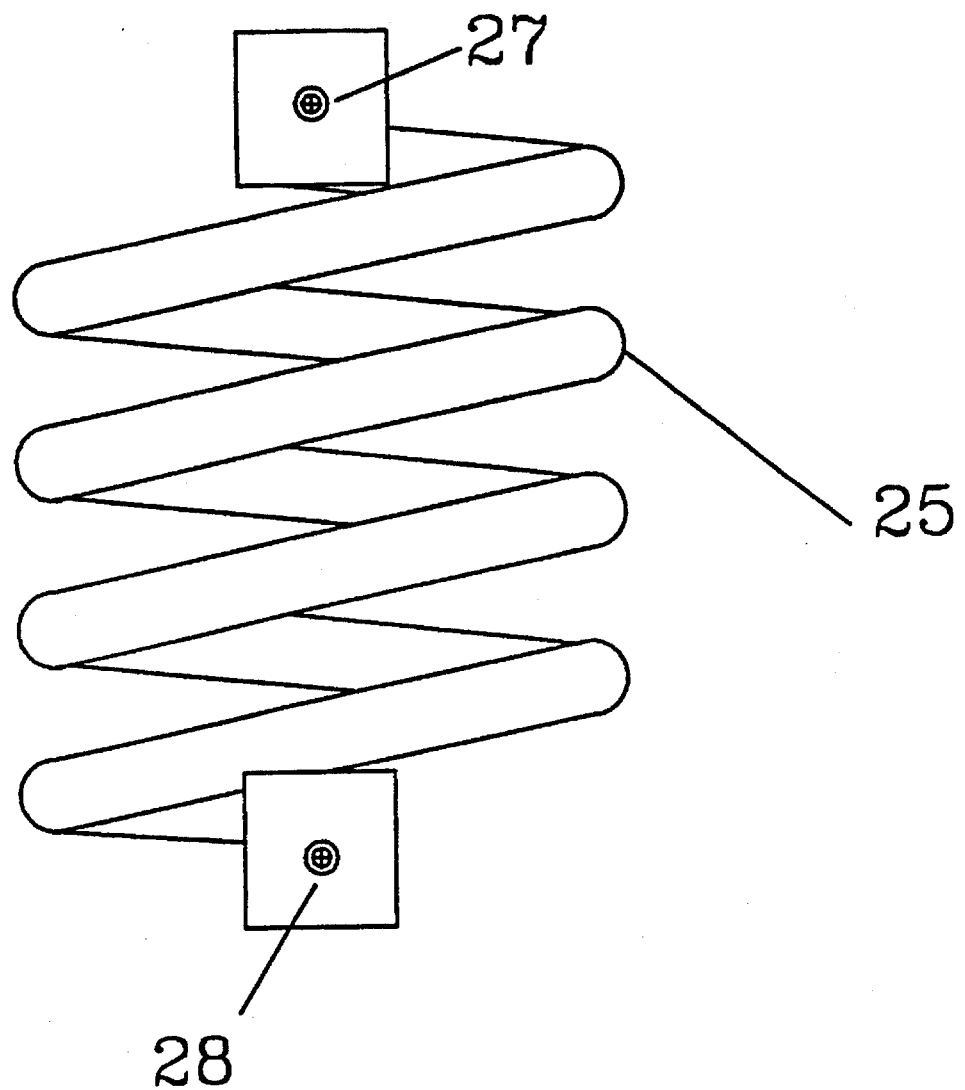
FIG. 4 is a side view of the spiral heater/magnet coil.

FIG. 3 illustrates the spiral heater/magnetic coil of the invention in combination with a Czochralski type crystal puller. A susceptor 10 is mounted on a graphite pedestal 18 and a crucible rotation shaft 19. Inside susceptor 10 is a quartz crucible 12. Quartz crucible 12 is filled with polysilicon 15. Susceptor 10 is heated by spiral/coil heater 25. Spiral/coil heater 25 is a graphite member coiled to form a spiral that terminates at terminals 27 and 28 (FIG. 4). The two ends of the conductors in the spiral coil are connected to terminal connection points 27 and 28. Power is applied to terminal connection points 27 and 28 to heat the coiled heater, and to provide a magnetic field around susceptor 10. In FIG. 3, a single power source 26 is used to supply current to coil 25, and to supply power to create the magnetic field around the susceptor 10. The heat from the coil is sufficient to supply power to melt the silicon in the quartz crucible and to create the necessary magnetic field for oxygen control.

FIG. 4 shows the spiral heater/magnetic coil 25. The graphite material is shown cut in a spiral fashion to form the coil 25, which is placed around the susceptor 10 of the Czochralski crystal puller.

What is claimed:

1. A method for controlling carbon content in silicon crystals pulled from a quartz crucible in a graphite susceptor in a Czochralski crystal puller, including the steps of:

enclosing the susceptor in a combination heater/magnetic coil; said heater/magnetic coil being formed from a graphite member which is cut in a spiral to form the coil which is placed around the susceptor;

applying power to the heater/magnetic coil; and maintaining the current in the coil at a value to melt the silicon, and to provide a magnetic field to control the generation of silicon oxide in the molten silicon during the crystal growing procedure.

* * * * *